United States Patent
Hurwitt

(10) Patent No.: US 6,689,254 B1
(45) Date of Patent: Feb. 10, 2004

(54) SPUTTERING APPARATUS WITH ISOLATED COOLANT AND SPUTTERING TARGET THEREFOR

(75) Inventor: Steven Hurwitt, Park Ridge, NJ (US)

(73) Assignee: Tokyo Electron Limited, Tokyo (JP)

( * ) Notice: Subject to any disclaimer, the term of this patent is extended or adjusted under 35 U.S.C. 154(b) by 1,826 days.

(21) Appl. No.: 08/439,490

(22) Filed: May 11, 1995

Related U.S. Application Data

(63) Continuation-in-part of application No. 07/816,137, filed on Dec. 31, 1991, now Pat. No. 5,409,590, which is a division of application No. 07/626,987, filed on Dec. 13, 1990, now Pat. No. 5,130,005, which is a continuation-in-part of application No. 07/606,701, filed on Oct. 31, 1990, now abandoned, which is a continuation-in-part of application No. 08/388,205, filed on Feb. 14, 1995, now Pat. No. 5,490,914, and a continuation-in-part of application No. 08/164,759, filed on Dec. 10, 1993, now Pat. No. 5,449,445, which is a continuation-in-part of application No. 07/791,415, filed on Nov. 13, 1991, now Pat. No. 5,284,561.

(51) Int. Cl.$^7$ .............................................. C23C 14/34
(52) U.S. Cl. ........................... 204/192.12; 204/298.09; 204/298.12; 204/298.11; 204/248.18; 204/298.19; 204/298.2
(58) Field of Search ...................... 204/192.12, 298.12, 204/298.19, 298.09, 298.11, 298.18, 298.2

(56) References Cited

U.S. PATENT DOCUMENTS

| | | | |
|---|---|---|---|
| 3,630,881 A | * 12/1971 | Lester et al. | ........ 204/298.12 X |
| 3,714,019 A | * 1/1973 | Orris | ..................... 204/298.12 |
| 3,741,886 A | * 6/1973 | Urbanck et al. | ....... 204/298.12 |
| 3,945,911 A | 3/1976 | McKelvey | .................. 204/298 |
| 4,407,708 A | * 10/1983 | Landau | .............. 204/298.19 X |
| 4,517,070 A | * 5/1985 | Kisner | ................ 204/298.19 X |
| 4,668,373 A | * 5/1987 | Rille et al. | .............. 204/298.12 |
| 4,855,033 A | 8/1989 | Hurwitt | ....................... 204/298 |

(List continued on next page.)

FOREIGN PATENT DOCUMENTS

| | | |
|---|---|---|
| GB | 2173217 | 10/1986 |
| GB | 2278368 | 11/1994 |
| WO | WO 9207970 | 5/1992 |

*Primary Examiner*—Rodney G. McDonald
(74) *Attorney, Agent, or Firm*—Wood, Herron & Evans, L.L.P.

(57) ABSTRACT

A sputtering apparatus is provided with a cathode assembly formed of a cathode unit having a moveable magnet assembly and a cooling water source therein, and a removable target assembly that includes a replaceable target unit and a removable and preferably reusable cooling jacket that seals to the rear face of the target unit and encloses a cooling cavity therebetween. Ducts are configured to automatically disconnect and reconnect the cooling cavity to the water source when the target assembly is removed from and reconnected in the cathode assembly. The target unit includes a volume of sputtering material on which is a front sputtering face, and has a recessed rim surrounding the sputtering face. The rim is configured to form a vacuum seal to the wall of a sputtering chamber and a water seal to the cooling jacket. Thereby, the magnet assembly is isolated from contact with the cooling liquid. A central connection, preferably in the form of a projecting hub, is centered at the target unit back and connects to a shaft in the cathode assembly to support the target material against distortion from pressure and heat variances, generally tending to force the center of the target into the processing chamber. Preferably, the target is formed of an integral piece of sputtering material, where the material permits, and otherwise the rim and hub may be part of a backing plate bonded to the target material to form the target unit. In either event, the back of the target unit is intrinsically, or is coated or otherwise treated to be, impermeable to contamination from the cooling water.

41 Claims, 3 Drawing Sheets

U.S. PATENT DOCUMENTS

| | | | |
|---|---|---|---|
| 5,130,005 A | | 7/1992 | Hurwitt .................. 204/192.12 |
| 5,240,580 A | * | 8/1993 | Henderson et al. . 204/298.11 X |
| 5,242,566 A | | 9/1993 | Parker ..................... 204/298.2 |
| 5,252,194 A | | 10/1993 | Demaray ................. 204/298.2 |
| 5,259,941 A | * | 11/1993 | Munz ................ 204/298.11 X |
| 5,269,894 A | * | 12/1993 | Kerschbaumer ... 204/298.12 X |
| 5,284,033 A | | 2/1994 | Lonati ....................... 66/149.5 |
| 5,284,561 A | | 2/1994 | Shinneman ............ 204/192.13 |
| 5,409,590 A | | 4/1995 | Hurwitt .................. 204/298.2 |
| 5,421,978 A | * | 6/1995 | Schuhmacher et al. ................. 204/298.19 X |

* cited by examiner

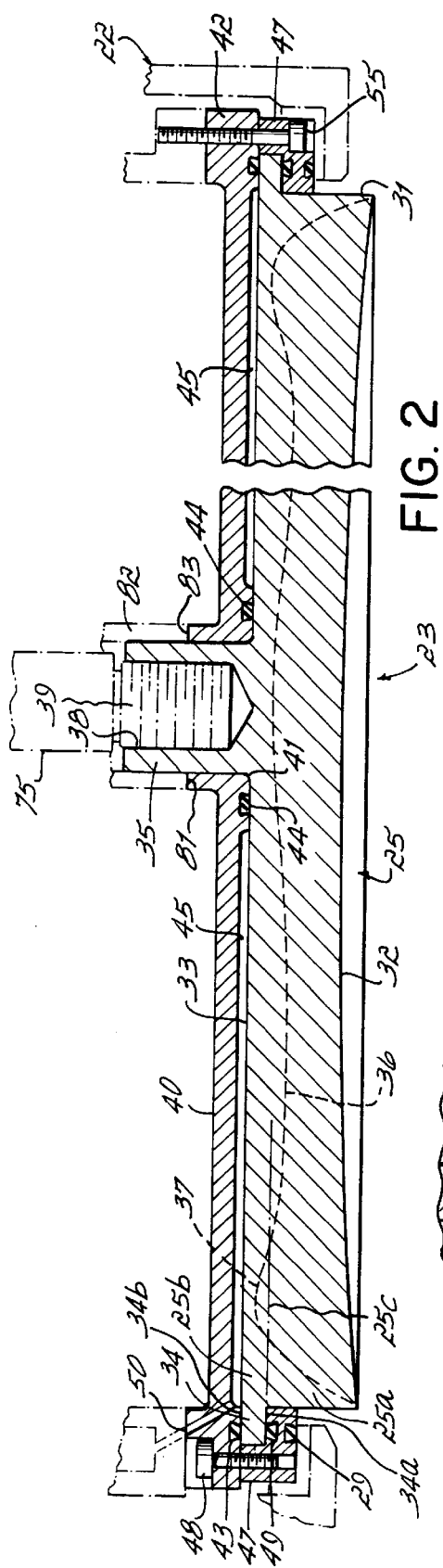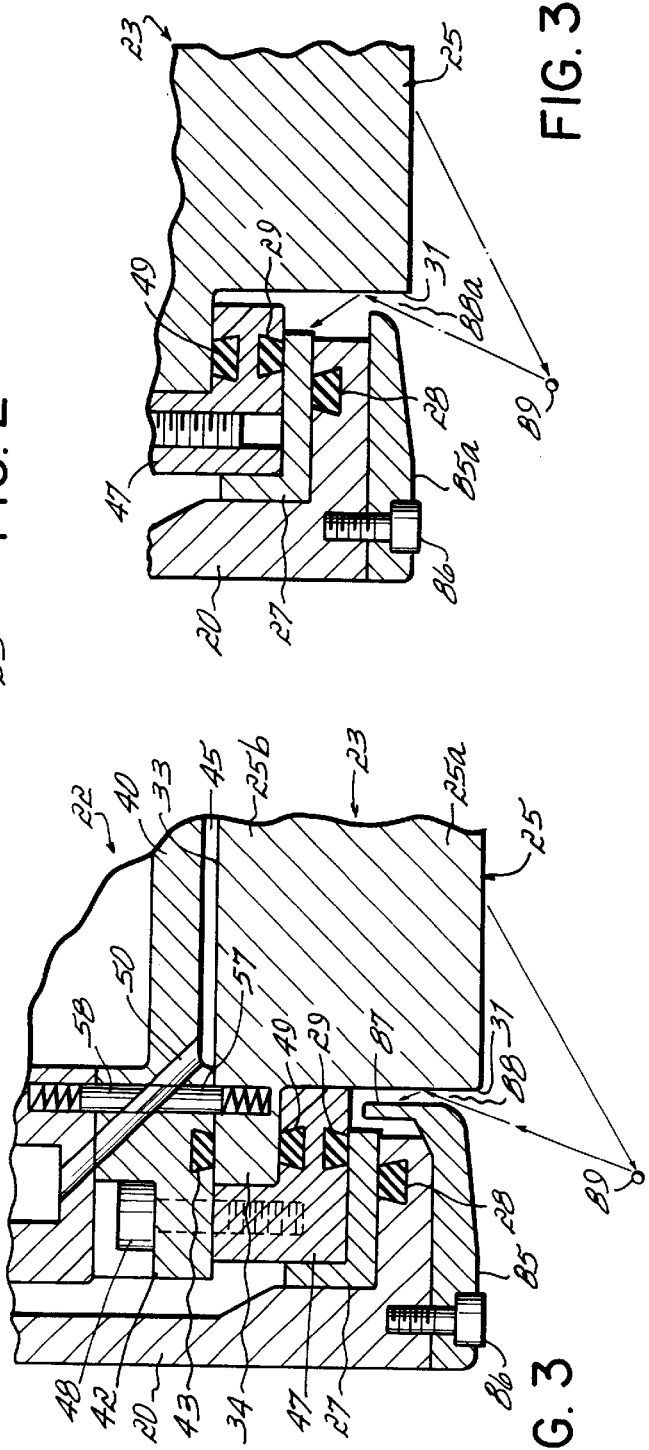

SPUTTERING APPARATUS WITH ISOLATED COOLANT AND SPUTTERING TARGET THEREFOR

This application is a continuation-in-part of U.S. patent application Ser. No. 07/816,137 filed Dec. 31, 1991 now U.S. Pat. No. 5,409,590, which is a divisional of U.S. patent application Ser. No. 07/626,987 filed Dec. 13, 1990, now U.S. Pat. No. 5,130,005, which is a continuation in part of U.S. patent application Ser. No. 07/606,701 filed Oct. 31, 1990 and now abandoned.

This application is also a continuation-in-part of U.S. patent application Ser. No. 08/388,205, filed Feb. 14, 1995 now U.S. Pat. No. 5,490,914, and of U.S. patent application Ser. No. 08/164,759 now U.S. Pat. No. 5,449,445, filed Dec. 10, 1993, which is a continuation-in-part of U.S. patent application Ser. No. 07/791,415, filed Nov. 13, 1991, and now U.S. Pat. No. 5,284,561.

FIELD OF INVENTION

This invention relates to cathode sputtering and more particularly to the configuring, utilizing and cooling of sputtering targets used in sputter deposition processes and to the cooling of such targets in an assembly in a sputtering cathode of a sputtering machine.

BACKGROUND OF THE INVENTION

In sputter deposition processes, substrates are placed adjacent to a sputtering target in a processing chamber and the pressure in the chamber is reduced to a high vacuum pressure level. A negative voltage is applied to the target to produce a plasma discharge, which is often intensified and confined over the target surface by the application of a magnetic field. The plasma production creates large quantities of positive ions in the sparse gas within the chamber that bombard the target and thereby dislodge atoms or small particles of target material from the surface of the target.

The ionic bombardment of the target surface transfers energy to the target, only a small percentage of which is imparted to the dislodged atoms or particles. Generally, about ninety percent of the electrical power applied to the plasma is converted to a heating of the target. With commonly used power densities in the area of 30,000 watts per square foot of target surface area, aggressive cooling of the target is required to prevent the melting or cracking of the target and to protect the target supporting cathode assembly and adjacent structures from overheating.

The cooling technique typically used in the prior art for removing heat from the target employs a flow of water against the back face of the target or against the backing plate to which the target is bonded in a thermally conductive manner. In some cathode assembly designs, the target supporting structure of the cathode assembly is water cooled, to indirectly cool the target, which is thermally attached in the cathode assembly, by conduction. In prior art cathode designs in which a target having a concave cone shaped target surface is employed, a thick target periphery or edge allows some degree of target cooling by heat flow at the periphery of the target. One such design is disclosed in U.S. Pat. No. 4,855,033, in which the primary cooling surface of the target is around the target periphery, where cooperating surfaces of the target and supporting target nest intermesh for enhanced heat conductivity. However, this deep cone shaped target, which erodes in a narrow ring, is less ideally suited for the coating of step shaped three dimensional surface features on objects like semiconductor wafers.

Furthermore, the cooling of other types of targets that relies on thermal conduction between the target and the target nest is limited by mechanical gaps that develop between the nest and target as mechanical distortions occur at high operating power. Such gaps can result in a reduction in the heat transfer outward from the target, which results in failures such as by the melting of the target.

More recent target designs, however, while providing improved performance in many respects and added coating capabilities, use targets that are thinner in relation to the sputtering surface dimensions, making the rear face of the target or of the target backing plate the primary surface suitable for cooling.

In many cathode designs, magnet structures are located behind the target rear face to shape and intensify the sputtering plasma. Often the magnet structure includes rotating magnets and associated structure that occupy much of the area of the rear target face. Examples of rotating magnet cathode assemblies are disclosed in U.S. Pat. Nos. 5,130,005, 5,252,194 and 5,242,566. Such target and cathode assemblies can be eroded in a controlled manner over the entire front face of the target providing improved coating of microscopic three dimensional features on the substrate surface. In many cases, the provision of such magnet assemblies results in design compromises between the magnet structure and the cooling capabilities, which limit the performance or reliability of the cathode and target as a unit.

In a rotating magnet apparatus, for example, cooling water has been made to flow in an inlet into a cavity behind the target and across the rear face of the target to an outlet. In such apparatus, the cooling of the target may be enhanced by the motion of the cooling water imparted by the rotary motion of a magnet carrier that rotates fully immersed in the cooling fluid in the cavity. However, the desired shape of target erosion is controlled by complexly shaped magnet structure which is rotated in bearings driven by drive gears, an input shaft, a drive belt and a motor. This immersion of components in cooling water can, over time, result in corrosion and degradation of the performance of the apparatus and a shortened life. Further, replacement of the depleted target can result in exposure of the cooling water cavity, as the target or backing plate is detached from the assembly. Such exposure can result in the introduction of small amounts of water, a primary contaminant of sputtered films, into the sputtering chamber.

For the reasons stated above, there is a need for a more effective and efficient structure for cooling a sputtering target.

SUMMARY OF THE INVENTION

It is a primary objective of the present invention to provide a sputtering cathode assembly in which a target can be effectively cooled without interfering with access to the target that is needed by magnet structure and other sputtering performance affecting components of the assembly. It is a particular objective of the present invention to provide cooling for a sputtering cathode assembly without intruding on space required by rotating magnet components and while maintaining the magnet components in isolation from cooling fluid. It is a more particular objective of the present invention to provide such a sputtering cathode assembly in which magnets, bearings and other motion drive components in particular are isolated from the cooling fluid. It is a still further objective of the present invention to provide a sputtering cathode assembly in which the cooling fluid is contained to prevent contamination of the processing chamber, particularly during removal and replacement of the sputtering target, and particularly while providing direct contact between the target and the cooling fluid during operation of the sputtering apparatus.

It is another objective of the present invention to provide a sputtering target that can be maintained in direct contact with cooling fluid when mounted in a sputtering cathode assembly while containing the cooling fluid so as to prevent contamination of the processing chamber during removal and replacement of the target. It is a still further objective of the present invention to provide a sputtering target that can be maintained in direct contact with a cooling fluid but that is protected against the contaminating or corrosive effects that the cooling fluid could have on the target itself. It is yet another objective of the present invention to provide a sputtering target that can be mounted so as to maintain a seal of the vacuum processing chamber and to maintain a seal of a cooling fluid cavity, preferably without the need for bonding the target to a structural backing plate or other such member, and without excessively increasing the nonproductive amounts of sputtering grade material required in the fabrication of the target.

According to the principles of the present invention, there is provided a sputtering target, particularly a target that is relatively thin in relation to the size of its sputtering front face, that is provided with a rear face that is adapted for contact by flowing cooling fluid maintained in a cavity behind the target, when the target is mounted in a sputtering cathode assembly. The preferred embodiment of the target is provided with an annular outwardly projecting target rim, which has a forward facing front edge having a vacuum-sealing surface that is adapted to form a vacuum tight seal with the sputtering chamber, and which has a rearward facing rear edge having a cooling fluid-sealing surface that is adapted to form a seal that surrounds the cooling fluid cavity. Preferably, the target, which is preferably circular, is formed of an integral single piece of sputtering grade material, the rear face of which is adapted to be maintained in direct contact with the cooling fluid. Additionally, the surface that is in direct contact with the fluid is preferably coated or otherwise sealed from contamination by the fluid, where the target is of a material that may absorb or otherwise interact with the fluid in a disadvantageous way.

Further, in one preferred embodiment, the target rim is preferably formed integrally of the single piece of sputtering grade material with the front and rear edges thereof adapted to support or form the seals. In addition, it is preferred that the center of the rear face of the target be provided with structure by which the center of the target can be supported, so that the target is supported at both the center and the rim thereof to prevent distortion or deformation of the target during use. Preferably also the supporting structure at the center of the target is a center hub extension formed integrally of the single piece of target material.

Further in accordance with the principles of the present invention, a sputtering cathode assembly is provided in which a sputtering target, either formed of an integral piece of sputtering material, or formed of a sputtering material bonded to a backing plate to provide the rear face thereof, is adapted to lie in contact with cooling fluid in a cavity, which is formed by sealing the target at the rear edge of its rim to a rim of the cathode assembly target mounting structure. In the preferred embodiment, the cathode assembly target mounting structure includes a cavity wall segment in the form of a cooling jacket that is removably mountable onto the cathode assembly and to which the target can be sealably secured, with the target back face forming an opposing wall to the cavity. The cooling jacket structurally connects the target to the cathode assembly and is removable as a target assembly with the target when the target is removed from the chamber for replacement.

Further in accordance with the preferred embodiment of the invention, the cooling fluid cavity is removable with the assembled target and cooling jacket, leaving the inlet and outlet port structure of the cathode assembly remaining with the cathode unit when a target is removed or replaced. Upon removal of the target and cooling jacket, seals between the cooling fluid ports in the cathode unit and cooling ducts in the removed cooling jacket automatically disconnect from each other and, preferably, seal against leakage of cooling fluid therefrom. More importantly, the magnet assembly, and particularly the drive linkage by which an assembly of rotating or otherwise moveable magnets, may be used in complete isolation from the cooling fluid, which has potentially corrosive effects.

Additionally in accordance with the preferred embodiment of the invention, distortion and deformation of the target is prevented by a structural support at the center of the target that cooperates with the mounting of the target around the target rim to hold the target firmly in a plane. The center support is preferably threaded into the target material or threaded into a central hub that is rigidly secured to the rear of the target material at the center of the target. The central support, which may also serve as a central axis about which a rotating magnet assembly may rotate, is further mounted at the back end thereof to structure that is rigid relative to the frame of the sputtering apparatus and to the chamber opening rim against which the target rim is sealed. This rigid attachment of the central support resists deformation of the target into the cavity due in part to the pressure gradient from the cooling fluid toward the vacuum of the processing chamber and in part to thermal distortion of the target due to expansion of the hot sputtering surface of the target relative to the cooled rear face of the target.

The present invention provides the advantages of effectively cooling a sputtering target, particularly where such cooling must be carried out across the rear face of the target. The cooling allows access to the rear face of the target for such magnet assemblies as are desired to shape and intensify the plasma on the front side of the target.

The present invention further provides the advantages of allowing effective rear face target cooling with cooling fluid while allowing for the use of magnet assemblies, particularly rotating or other moving magnet assemblies, that may remain isolated from the cooling fluid.

Further with the present invention, there is provided a target that can be operated with its rear face in direct contact with cooling fluid, while the surface of the target material that is in contact with the fluid is protected from a disadvantageous interaction with or contamination by the fluid. A separate backing plate may be eliminated in some embodiments of the invention by the provision of a target rim that utilizes only a small amount of sputtering grade material but seals directly against the sputtering chamber wall and the cooling fluid cavity.

Further, the invention provides the advantage of allowing removal of a sputtering target for replacement, where the target is cooled by direct contact with the cooling fluid, without allowing leakage of the fluid that can cause contamination of the sputtering chamber.

The present invention provides the further advantages of rigidly supporting a relatively thin target against pressure gradient and thermal deformation, which is particularly advantageous with the trend to targets of larger and larger diameter.

BRIEF DESCRIPTION OF THE DRAWINGS

FIG. 2 is an enlarged cross-sectional view illustrating a sputtering target and cooling fluid cavity of the cathode assembly of FIG. 1.

FIG. 3 is an enlarged partial cross-sectional view of a portion of FIG. 2 illustrating fluid ducts or ports to the fluid cavity and protective insulator shield.

FIG. 3A is a view similar to FIG. 3 illustrating a shield in the form of the prior art.

DETAILED DESCRIPTION OF THE PREFERRED EMBODIMENT

Figure 1:
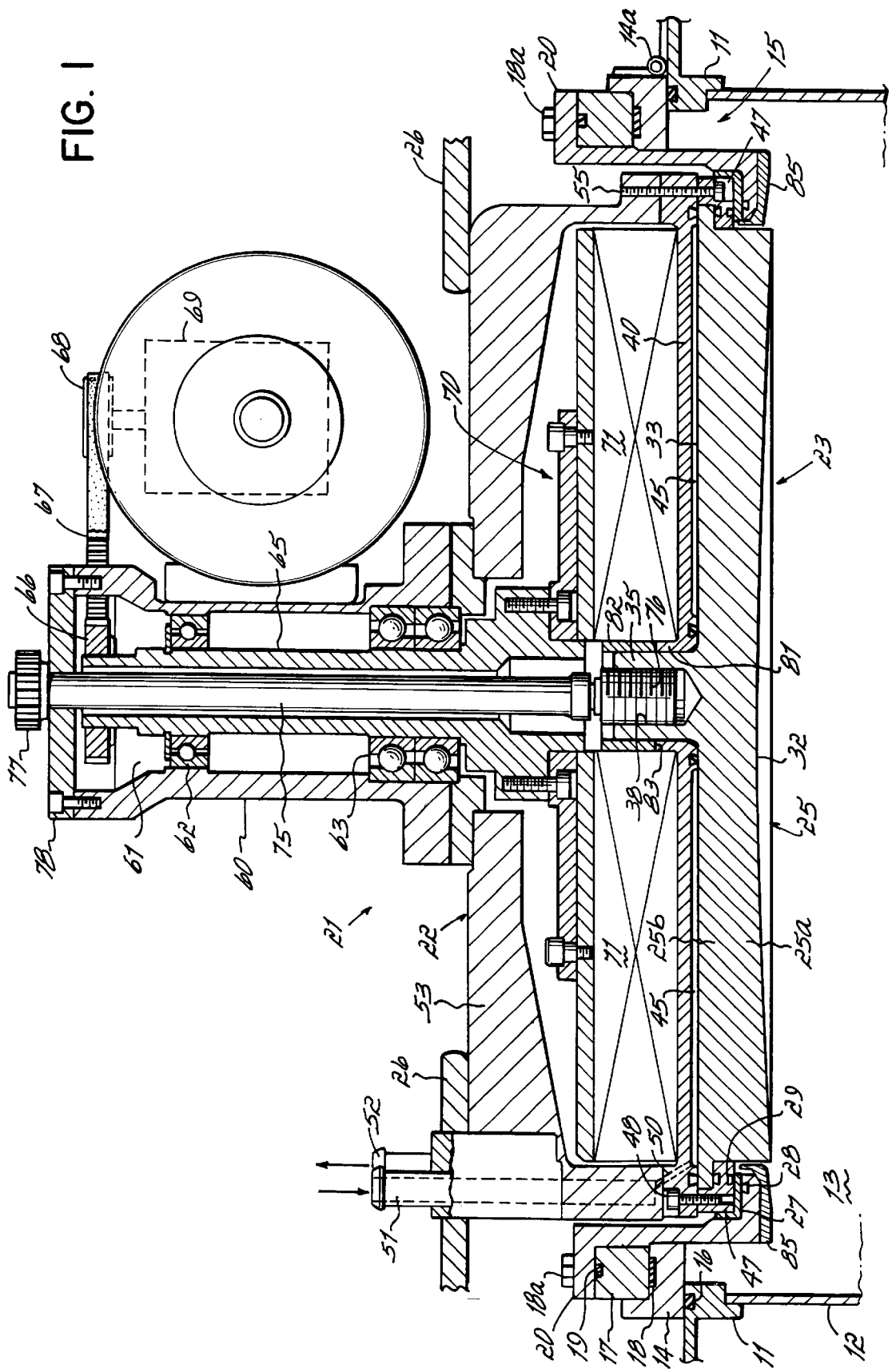
FIG. 1 is a cross-sectional view of a portion of a sputtering apparatus illustrating particularly a sputtering target and cathode assembly according to a preferred embodiment of the present invention.

Referring to FIG. 1, a portion of a sputtering apparatus 10 is illustrated showing an apparatus frame 11 having fixed thereto structure that forms part of the wall 12 of a vacuum processing chamber 13 of the apparatus 10. A target access door or other removable panel 14 is hinged or by hinge 14a otherwise removably connected to the frame 11 at an opening 15 to the chamber 13. The door 14, when closed, forms a vacuum tight seal to the frame 11 through a seal 16. Welded to the side of the door 14 opposite the chamber 13 is a door frame member 17 which encloses a door frame cooling passage 18 between the door 14 and the door frame member 17. An additional seal 19 is provided on the opposite side of the door frame member 18 to form a vacuum tight seal between the door frame member 18 and an annular cathode assembly adapter flange 20, which is bolted to the door frame member 18 by bolts 18a.

Removably mounted to the adapter flange 20 is a sputtering cathode assembly 21, which includes a cathode unit and target support 22 and a target assembly 23, which contains a replaceable expendable sputtering target 25. The cathode assembly 21 is held to the flange 20 by a set of electrically insulated clamping members 26 spaced around the opening 15 and secured to the frame 11. The clamping members 26 urge the assembly 21 against the flange 20. Between the flange 20 and the cathode assembly 21 is an electrically insulating ring 27 formed of a non-electrically conductive material such as Teflon™. Between the insulating ring 27 and the flange 20, and between the insulating ring 27 and the cathode assembly 21, are a pair of O-ring seals 28 and 29 that maintain a vacuum tight seal with the intervening insulator 27 between the flange 20 and the cathode assembly 21. Removal of the cathode assembly 21 from the adapter flange 20 is carried out by releasing the clamps 26 and separating the cathode assembly 21 from the flange 20 at the insulator 27.

The portion of the cathode assembly 21 that mounts against the flange 20 is the target assembly 23, which is illustrated in solid lines in FIG. 2. The target assembly includes the target 25 which, for materials that are reasonably machinable such as titanium and aluminum alloys, is preferably formed of a single integral piece of sputtering material that has a generally circular periphery 31, a sputtering surface or target face 32, a coolant fluid impermeable and preferably corrosion resisting rear face 33, an annular lip or rim 34 extending outwardly from the periphery 31 and spaced rearwardly from the target face 32 proximate the rear face 33 of the target 25, and a central rearwardly projecting hub 35, all preferably formed integrally from the same piece of sputtering material. The rim 34 has a forward facing face or surface 34a, recessed rearwardly from the target face 32, which is polished, coated or otherwise processed in a manner that will effectively support a vacuum seal. Similarly, the rim 34 has a rearwardly facing rear face or surface 34b that is polished, coated or otherwise processed in a manner that will effectively support a fluid tight seal.

For targets 25 of some types of sputtering materials such as silicon or certain magnetic materials, the sputtering material itself does not have the physical properties to provide sufficient structural strength to support the assembly 21 or to enable its formation, by machining for example, into the desired configuration. With such materials, a target 25 is preferably formed of a disc 25a of sputtering material bonded by soldering or some other conventional technique to a backing plate 25b at a bonding surface 25c, as illustrated as the straight phantom line to the left in FIG. 2. With such a bonded target, the rim 34 is formed on the backing plate portion 25b. With a target 25 formed of sputtering material without the backing plate 25b, where the material permits, greater target utilization is possible, as is apparent from the erosion profile 36 illustrated by the curved broken line in FIG. 2, which shows an erosion groove 37 that may exceed the depth of the bonding surface 25c, were one present. With either a bonded or an integral target 25, the central hub 35 may be formed of a separate piece of material and fastened to the rear face 33 of the target 25, but is preferably integral with the target material or backing plate of the target 25. The central hub 35 of the target 25 should be formed of a material that will support threads 38 in a central bore 39 therein, or that will support a threaded insert.

The water impermeable and corrosion resisting rear face 33 is easily provided for targets 25 that incorporate a backing plate 25b by selection of the material and service finish of the rear face of the backing plate. With targets 25 that are formed of an integral piece of sputtering material on which the rear face is formed, certain materials such as titanium and some alloys of aluminum have sufficient intrinsic water impermeability and non-corrosive properties to form the cooling surface on the rear face to directly contact cooling fluid. The corrosive effects of water on some target materials can be prevented by chemical treatment of the rear surface of the target, by treatment such as anodizing on aluminum targets, or by the application of coating films or layers of, for example, organic materials on porous targets, such as those of sintered titanium-tungsten. With sputtering materials such as silicon, however, even though the material itself may have sufficient intrinsic water impermeability, the use of a protective backing plate will prevent water contamination of a more serious nature, such as a total flooding of the processing chamber that could be caused if a brittle silicon target, without a backing plate, were to structurally fail.

The target assembly 23 further includes a cooling jacket 40, which is preferably a non-expendable reusable part of the target, assembly 23 that is removable from the target 25 for connection to a replacement target. In the alternative, the cooling jacket 40 may be expendable along with the target 25 and replaced as part of the new replacement target. The cooling jacket 40 has formed thereon a central lip 41 and a peripheral lip 42 that seat against the back face 33 of the target 25, each lip 41,42 having an O-ring seal 44 and 43 respectively seated therein. When so connected, the jacket 40 encloses a space between it and the back face 33 of the target 25 that defines a cooling channel 45. The cooling channel 45 may have the shape of an annular disc as illustrated, or some other configuration such as a pattern of grooves in the jacket 40, or a plurality of vanes spaced by upstanding ribs in the cooling jacket 40. The cooling channel 45 is configured so as to cooperate with the differential pressure of cooling fluid to and from the channel 45 to cause a high velocity of cooling fluid through the channel 45 along the back face 33 of the target 25, thereby enhancing the flow of heat from the target 25 to the fluid. To further enhance this thermal conductivity, the cooling jacket 40 may also be provided with ducts that include impingement jets directed toward the target back face 33, or such other conductivity enhancing features as are more particularly disclosed in the copending commonly assigned U.S. patent application Ser. No. 08/398,743, filed Feb. 15, 1995, and expressly incorporated herein by reference.

The target assembly 23 also includes, in one embodiment, an annular clamp ring 47 that surrounds the outer periphery 31 of the target 25 and overlies the outer lip or rim 34 of the target 25 opposite the jacket outer lip 42, to which it is held by a plurality of approximately twelve screws 48 spaced around the cooling jacket outer rim 42. The screws 48 are accessible from the back of the jacket 40 and thread into threads in the clamp ring 47. The clamp ring 47 has an O-ring seal 49 seated in an annular groove in the back thereof to seal to the outer rim 34 of the target 25. The clamp ring 47 also carries the seal 29 in an annular groove in the front thereof.

The cooling jacket 40 contains a pair of ducts, or arrays of ducts, 50 for communicating cooling fluid between the channel 45 and inlet and outlet ports 51 and 52, respectively, in a cathode body 53 (FIG. 1) of the cathode unit and target support 22 of the cathode and target assembly 21. Preferably, the ports 51 and 52 and ducts 50 are formed in a stainless steel or other non-corrosive attachment (not separately shown) to the cathode body 53. The cathode body 53 is the main structural frame of the cathode unit 22 against which the clamps 26 bear to urge the cathode assembly 21 against the insulator 27. The target assembly 23 is secured to the cathode body 53 by a set of screws 55, approximately four in number, which also serve in place of some of the screws 48 in clamping the clamp ring 47 to the cooling jacket 40. The screws 55 are accessible when the cathode assembly 21 is unclamped from the adapter bracket 20 of the door 14.

When the target assembly 23 is removed from the cathode unit 22, the ducts 50 automatically disconnect. By "automatically" is meant that the disconnection of the ducts 50 does not require additional operator action, such as the separate disconnection of tubing leading to the ports 51,52, or other step to disconnect the cooperating parts of structure surrounding the ducts 50. When the target assembly 23 is reconnected to unit 22, the ducts 50 automatically reconnect. To more positively isolate the fluid in the parts 51, 52 and cavity 45, each of the ducts 50 may be provided with a spring biased or other type of valve element 57, 58, in the cooling jacket 40 and cathode body 53 to close off the ducts 50 when the target assembly 23 is removed from the cathode unit 22 by removal of the screws 55, as illustrated in FIG. 3.

The cathode body 53 is structurally rigid. Fixed to the back thereof is a spindle housing 60 which is also structurally rigid. The spindle housing 60 has a bore 61 therethrough in which are carried two sets of bearings 62 and 63 on which is rotatably supported a spindle shaft 65. At the back end of the shaft 65 is a drive pulley 66 around which extends a drive belt 67 that connects the pulley 66 to the output shaft 68 of a magnet drive motor 69. At the front end of the shaft 65 is fixed a magnet assembly 70 that rotates with the shaft 65 under the power of the motor 69. The magnet assembly 70 includes a magnet pack 71, preferably formed of a specially configured loop of permanent magnets that is designed to produce desired erosion profile 37 on the target 25. Details of the preferred configuration of the magnet assembly 70 are set forth in U.S. Pat. No. 5,130,005, expressly incorporated herein by reference. When the magnet assembly 70 rotates, the magnets 71 are maintained out of contact with the body 53 and the back of the cooling jacket 40. Because the coolant, however, is maintained in channel 45 out of communication with the magnet assembly 70, the corrosive effect of the cooling fluid, which is usually water, on the magnet assembly 70 and the magnet rotating components is avoided, thus easing the corrosion resistance requirements on their design.

Additional support at the center hub 35 of the target 25 is provided by a central support rod 75 that has threads 76 at its front end that directly thread into the threads 38 in the central bore 39 in the hub 35 of the target 25. The rod 75 is secured at its back end by a threaded nut 77 which draws snugly against a cap plate 78 that is bolted to the back end of the spindle 60. The shaft 75 so installed provides a tension force that resists the deformation of the target center into the processing chamber 13 due to forces caused by the pressure of the cooling fluid in the cavity 45 and by the thermal stresses in the target 25 during sputtering. Precise registration of the position of the center of the target 25 is achieved by provision of a shoulder 81 on the forward end of a cylindrical spacer 82 that abuts with the rearward surface 83 of inner rim 41 of the cooling jacket 40. The shoulder 81 is drawn against the surface 83 of the jacket 40 by the tension on the shaft 75 (FIG. 2). This tension also causes the inner rim 41 on the jacket 40 to seat tightly against the rear face 33 of the target 25 and to compress the seal 44 that isolates the cooling fluid in the channel 45 at the center of the target 25. This support structure facilitates the direct mechanical drive between the motor 69 and the shaft 75, without the need for offset drive gears.

Referring again to FIG. 3, at the inner end of the cathode adapter 20 is mounted a shield 85, which secured to the adapter 20 by screws 86 spaced around the shield 85. The shield 85 is provided with a rearwardly projecting lip 87, shaped and positioned so as to face the outer periphery 31 of the target 25 in close proximity thereto, spaced only by a gap 88 that is wide enough to avoid arcing between the target 25 and the shield 85. The inner lip 87 of the shield 85 protects the electrical insulator 27 against material sputtered from the target 25 passing through the gap 88 and lighting upon, and thus providing a possibly conductive path across, the insulator 27, which would cause arcing across the path. With shields 85a of the prior art, as illustrated in FIG. 3A, a small portion of the material sputtered from the target 25 will bounce from sputtered gas molecules, such as indicated at 89, and enter the gap 88a, contributing to the eventual buildup of deposits on the insulator 27. The shield 85 with the lip 87 interrupts the path of such particles 89 and protects the insulator 27 from such buildup.

Figure 4:
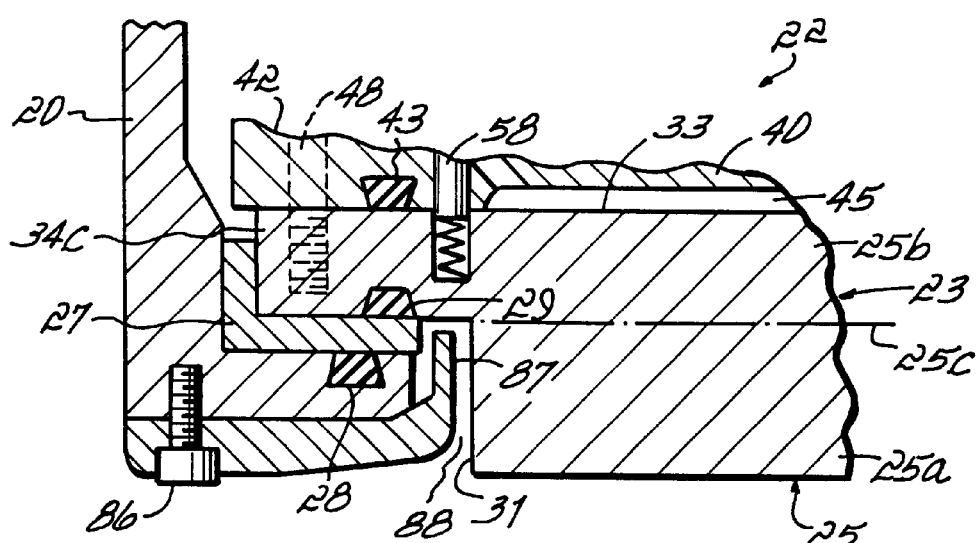
FIG. 4 is a view similar to FIG. 3 of an alternative embodiment in which the projecting target unit rim also performs the function of a clamping ring.

FIG. 4 illustrates an alternative embodiment of the target assembly 23 and cathode assembly 22 in which the clamping ring 47 is formed integrally with the outer rim 34 of the target 25, illustrated as rim 34c in FIG. 4. In this embodiment, the threads of the bolts 48 are threaded directly into the back of the target 25, and the seal 29 is set in a groove in the front face 34a of the rim 34. The seal 49 of FIG. 3 is unnecessary. In FIG. 4, the rim 34c is illustrated a peripheral extension of backing plate portion 25b of the target 25. Where no backing plate 25b is employed with the target material portion 25a bonded thereto at the surface 25c, and the target 25 is formed of an integral piece of sputtering material, the rim 34c is formed entirely integrally of such sputtering material. Such arrangement is acceptable where the target 25 is formed of a structurally sound material such as aluminum or certain metallic alloys. The embodiment of FIG. 4 allows the sputtering face 23 of the target 25 to be maintained closer to the magnets 71, which is particularly helpful where the sputtering material of the target is a magnetically soft or high permeability material.

With the present invention, the effective cooling of the target 25 is provided while allowing removal and replacement of the target 25 without the release of cooling fluid into the chamber 13 or otherwise onto the machine 10 or the vicinity of the machine 10. Removal of a spent target 25 is achieved by loosening of the clamps 26 and releasing of the entire cathode assembly 21 into a space behind the chamber 13. With many types of cathode assembly structures, particularly large ones, the loosened assembly 21 remains supported on hinged brackets or on slides (not shown) mounted on the frame 11 of the machine 10. Otherwise, the target 25 may be placed on a support surface. With such removal of the cathode assembly 21, the electrical connections that consist of wires to the motor 69 and power leads (not shown) to the target assembly 23, need not be disconnected. Similarly, cooling fluid tubes that connect to the inlet and outlet ports 51,52 respectively to a cooling water supply and drain (not shown) may remain connected also. It is desirable, nonetheless, to purge cooling fluid from the ducts 50 and the channel 45 by flowing air through the inlet port 51 to the outlet port 52.

When the cathode assembly 21 has been removed from the door 14 by the loosening of the clamps 26, the target assembly 23 is disconnected from the cathode unit 22 by removal of the screws 55 that hold the clamp ring 47 and cooling jacket 40 to the cathode body 53, and by loosening the nut 77 that holds the shaft 75 in the spindle 60. Due to the screws 48, which remain in place on the target assembly 25, the target assembly 25 remains intact. The shaft 75 generally remains with the target assembly 23, but it might loosen from the target at the threads 76 at its threaded forward end rather than at the nut 77, in which case it must be later removed from the threads 38 at the bore 39 at the target central hub 35. With the channel 45 and ducts 50 purged of cooling fluid, leakage of fluid from the ducts 50 will be minimal as the target assembly 23 is removed from the cathode body 53 and disassembled. Where valves 58 are provided in the ducts 50, likelihood of even small leakage of cooling fluid is further reduced, as the valves move under the force of their springs to block off the ducts 50 as the jacket 40 is separated from the cathode body 53.

When the target assembly 25 has been removed from the cathode unit 22, the target assembly may be moved to a remote location where the target 25 may be disconnected from the cooling jacket 40 and replaced with another target 25. This replacement process is carried out by removal of the screws 48 from the target assembly 23 to release the clamp ring 47 and to permit removal of the target 25. With a new target 25 in place of the old expended target 25, the screws 48 are replaced and the clamp ring 47 is resecured, and the assembled target assembly 23 is then reconnected to the cathode unit 22 by replacement of the screws 55. As the jacket 40 is brought against the cathode body 53, the valves 58, which will be extended beyond the surfaces of the jacket 40 and body 53 by their springs, will be forced by the engagement with the surfaces of the opposite one of the body 53 and jacket 40, to cause the ducts 50 to reopen to the free passage of cooling fluid therethrough. The shaft 75 is then replaced and the nut 77 tightened, completing the reassembly of the cathode assembly 21, which can then be resecured to the door 14 by tightening of the clamps 26.

From the above, it will be apparent to those of ordinary skill in the art that changes and additions can be made to the embodiments described and above and illustrated in the drawings without departing from the principles of the present invention. Therefore,

What is claimed is as follows:

1. A replaceable sputtering target comprising:
   a circular target unit that is formed at least in part of a volume of sputtering material, the unit having a forward facing front sputtering face of the sputtering material and a rearward facing rear face having a water impermeable cooling surface lying in an annular area thereon around a center;
   a recessed peripheral rim having:
      a forward facing annular front edge having a vacuum-sealing surface thereon surrounding the front sputtering face, the front edge being spaced rearwardly of the forward face of the target unit, and
      a rearward facing annular rear edge having an outer water-sealing surface thereon surrounding the rear face of the target unit;
   tension maintaining support structure fixed at the center on the rear face, and
   the rear face having an annular inner water-sealing surface thereon surrounding the tension maintaining support structure.

2. A replaceable sputtering target for use in a sputtering apparatus having a vacuum chamber surrounded by a chamber wall and having a substrate support mounted therein, a sputtering cathode assembly mounted in an opening in the chamber wall, the cathode assembly including a housing, a plasma shaping and confining magnet assembly carried by the housing, and a target assembly removably connected to the housing where the target assembly includes a cooling jacket connected in water-sealing relationship to the back of a target to enclose a cooling water cavity between the cooling jacket and the target and removable with the target from the cathode assembly, an electrical insulator between the cathode assembly and the chamber wall around the opening and surrounding the sputtering face of the target; and a power supply having a negative output connected to the cathode assembly and a positive output connected at least indirectly to the chamber wall, the target comprising:
   a circular target unit that is formed at least in part of a volume of sputtering material, the unit having a forward facing front sputtering face of the sputtering material and a rearward facing rear face having a water impermeable cooling surface lying in an annular area thereon around a center, the rear face being configured to form a boundary of the cavity in direct contact with cooling fluid in the cavity when the target unit is connected to a cooling jacket;
   a forward facing front edge having a vacuum-sealing surface thereon bordering the front sputtering face to form a vacuum seal when the target is connected in the apparatus; and
   a rearward facing rear edge having a water-sealing surface thereon bordering the rear face of the target unit to seal the cavity when the target is connected to the cooling jacket.

3. The replaceable sputtering target of claim 2 wherein:

the circular target unit, including the recessed peripheral rim thereof, is formed of an integral volume of the sputtering material; and the rearward facing rear face, the water impermeable cooling surface, the front and rear edges and the vacuum-sealing and water sealing-surfaces are on the sputtering material.

4. The replaceable sputtering target of claim 3 wherein:

the tension maintaining support structure is integrally formed of the volume of sputtering material.

5. The replaceable sputtering target of claim 3 wherein:

the impermeable cooling surface has thereon a water impermeable layer thereon.

6. The replaceable sputtering target of claim 5 wherein:

the water impermeable layer is a coating on the impermeable cooling surface.

7. The replaceable sputtering target of claim 5 wherein:

the water impermeable layer is a coating of an organic material on the cooling surface.

8. The replaceable sputtering target of claim 5 wherein:

the impermeable layer is a coating of material formed by chemical reaction with the sputtering material.

9. The replaceable sputtering target of claim 5 wherein:

the impermeable layer is a backing plate to which the sputtering material is bonded.

10. The replaceable sputtering target of claim 2 wherein:

the circular target unit includes a circular backing plate of structural material having a rear side that forms the rearward facing rear face and a front side;

the volume of sputtering material is bonded in a thermally conductive interface to the front side of the backing plate;

the recessed peripheral rim is formed integrally of the backing plate; and the tension maintaining support structure is fixed to the rear side of the backing plate.

11. The replaceable sputtering target of claim 2 wherein:

the forward facing front sputtering face is smoothly and continuously concave;

the rearward facing back face is planar.

12. The replaceable sputtering target of claim 2 wherein:

the tension maintaining support structure extends rearwardly from the rear face.

13. The replaceable sputtering target of claim 12 wherein:

the tension maintaining support structure has helical threads formed therein.

14. The replaceable sputtering target of claim 12 wherein:

the tension maintaining support structure has a shoulder formed thereon to limit rearward deformation of the target when tension is applied to the tension maintaining support structure.

15. A removable sputtering target assembly comprising:

a replaceable target unit formed at least in part of a volume of sputtering material, the unit having a forward facing front sputtering face of the sputtering material and a rearward facing rear face having a water impermeable cooling surface lying in an area thereon;

the target unit having a forward facing front peripheral edge having a vacuum-seal surface thereon surrounding the front sputtering face and a rearward facing rear edge having a water-seal surface thereon surrounding the rear face of the unit; and a cooling jacket connected to the back of the target unit and having a forward facing peripheral edge having a water-seal surface thereon in water sealing engagement with the water-sealing surface on the rearward facing edge of the target unit so as to enclose a cooling water cavity between the cooling jacket and the cooling surface, the cooling jacket having cooling water ports therein communicating with the cooling water cavity.

16. The removable sputtering target assembly of claim 15 wherein:

the cooling jacket is a reusable cooling jacket and is removably connected to the target unit.

17. A sputtering cathode assembly comprising:

a housing;

a plasma shaping and confining magnet assembly carried by the housing;

a target assembly removably connected to the housing, the target assembly including:

a replaceable target unit having a back and formed at least in part of a volume of sputtering material having a front sputtering face thereon, and a cooling jacket connected in water-sealing relationship to the back of the target unit to enclose a cooling water cavity between the cooling jacket and the target unit, the cooling jacket having cooling water ports therein communicating with the cooling water cavity, the target unit having a rear face positioned to be in direct cooling contact with flowing cooling water within the cavity, the cooling jacket configured to protectively isolate the magnet assembly from cooling water in the cavity; and a supply of flowing cooling water detachably connectable to the cooling water ports upon the removable connection of the target assembly to the housing.

18. The sputtering cathode assembly of claim 17 wherein:

the cooling jacket is a reusable cooling jacket and is removably connected to the target unit.

19. The sputtering cathode assembly of claim 17 wherein:

the target unit includes a backing plate to which the sputtering material is bonded to form a thermally conductive interface therewith, the backing plate having the rear face thereon positioned to be in the direct cooling relationship with the water in the cavity.

20. The sputtering cathode assembly of claim 17 wherein:

the magnet assembly includes magnets moveable relative to the target unit, a magnet moving drive and mechanical linkage driveably connecting the magnets to the drive; and the magnets, drive and linkage are isolated from the cooling water in the cavity.

21. The sputtering cathode assembly of claim 17 wherein:

the magnet assembly includes magnets rotatable relative to the target unit, a magnet rotating drive and mechanical linkage driveably connecting the magnets to the drive; and the magnets, drive and linkage are isolated from the cooling water in the cavity.

22. The sputtering cathode assembly of claim 17 wherein:

the cooling water ports in the jacket are configured and aligned with cooling water ducts of the supply so as to automatically connect and disconnect therefrom respectively upon connection of the target assembly to the housing and disconnection of the target assembly from the housing.

23. The sputtering cathode assembly of claim 17 further comprising:

means for influencing the fluid flow in the cavity to enhance the transfer of heat from the rear face of the target unit into the fluid.

24. The sputtering cathode assembly of claim 17 further comprising:
  a central tension bearing structural support member detachably connected between the housing and the center of the target unit.

25. The sputtering cathode assembly of claim 24 wherein the magnet assembly includes:
  magnets rotatable relative to the target unit;
  a magnet rotating drive carried by the housing; and
  mechanical linkage, mounted concentric with the support member, driveably connecting the magnets to the drive.

26. The sputtering cathode assembly of claim 25 wherein:
  the mechanical linkage includes a hollow spindle fixed to the magnets and rotatably mounted on the housing; and
  the support member extends through the hollow spindle.

27. A sputtering apparatus comprising:
  a vacuum chamber surrounded by a chamber wall and having a substrate support mounted therein;
  a sputtering cathode assembly mounted in an opening in the chamber wall, the cathode assembly including a housing, a plasma shaping and confining magnet assembly carried by the housing, and a target assembly removably connected to the housing;
  the target assembly including:
    a replaceable target unit having a back and formed at least in part of a volume of sputtering material having a front sputtering face thereon, and
    a cooling jacket connected in water-sealing relationship to the back of the target unit to enclose a cooling water cavity between the cooling jacket and the target unit, the target unit having a rear face positioned to be in direct cooling contact with flowing cooling water within the cavity, the cooling jacket being removable with the target from the cathode assembly;
  an electrical insulator between the cathode assembly and the chamber wall around the opening and surrounding the sputtering face of the target; and
  a power supply having a negative output connected to the cathode assembly and a positive output connected at least indirectly to the chamber wall.

28. The sputtering apparatus of claim 27 further comprising:
  an annular shield surrounding the opening in the chamber wall and spaced across a narrow gap from the target, the shield having a portion thereof at least partially protectively surrounding the insulator.

29. The sputtering apparatus of claim 28 wherein:
  the shield has a generally flat forward facing portion, an outside periphery and an inside periphery surrounding the target front face and spaced across the narrow gap from the target; and
  the shield has a radially inwardly facing lip portion extending rearwardly from the inside periphery and forming an elongated narrow passage from the sputtering chamber to the insulator thereby protecting the insulator from coating with sputtered material from the chamber.

30. The sputtering apparatus of claim 27 wherein:
  the cooling jacket has cooling water ports therein communicating with the cooling water cavity, and
  the apparatus further comprises a source of flowing cooling water detachably connectable to the cooling water ports upon the removable connection of the target assembly to the housing.

31. The sputtering cathode assembly of claim 27 wherein:
  the cooling jacket is a reusable cooling jacket and is removably connected to the target unit.

32. The sputtering cathode assembly of claim 27 wherein:
  the target unit includes a backing plate to which the sputtering material is bonded to form a thermally conductive interface therewith, the backing plate having the rear face thereon in direct cooling relationship with the water in the cavity.

33. The sputtering cathode assembly of claim 27 wherein:
  the cooling jacket is configured to protectively isolate the magnet assembly from cooling water in the cavity.

34. The sputtering cathode assembly of claim 33 wherein:
  the magnet assembly includes magnets moveable relative to the target unit, a magnet moving drive and mechanical linkage driveably connecting the magnets to the drive; and
  the magnets, drive and linkage are isolated from the cooling water in the cavity.

35. The sputtering cathode assembly of claim 33 wherein:
  the magnet assembly includes magnets rotatable relative to the target unit, a magnet rotating drive and mechanical linkage driveably connecting the magnets to the drive; and
  the magnets, drive and linkage are isolated from the cooling water in the cavity.

36. The sputtering cathode assembly of claim 30 wherein:
  the cooling water ports in the jacket are configured and aligned with cooling water ducts of the supply so as to automatically connect and disconnect therefrom respectively upon connection of the target assembly to the housing and disconnection of the cathode assembly from the housing.

37. The sputtering cathode assembly of claim 30 further comprising:
  means for influencing the fluid flow in the cavity to enhance the transfer of heat from the rear face of the target unit into the fluid.

38. The sputtering cathode assembly of claim 27 further comprising:
  a central tension bearing structural support member detachably connected between the housing and the center of the target unit.

39. The sputtering cathode assembly of claim 38 wherein the magnet assembly includes:
  magnets rotatable relative to the target unit;
  a magnet rotating drive carried by the housing; and
  mechanical linkage, mounted concentric with the support member, driveably connecting the magnets to the drive.

40. The sputtering cathode assembly of claim 39 wherein:
  the mechanical linkage includes a hollow spindle fixed to the magnets and rotatably mounted on the housing; and
  the support member extends through the hollow spindle.

41. A method of replacing a sputtering target in a sputtering apparatus comprising the steps of:
  disconnecting a used target from the cathode assembly of the apparatus by removing the used target with a cooling jacket containing a cooling fluid cavity attached to the back of the target with the back face of the used target forming a surface of the cavity;
  then, separating the used target from the cooling jacket, replacing the used target with a new target, connecting the new target to the cooling jacket with the cooling fluid cavity in contact with the back face of the new target;
  then, connecting the new target to the cathode assembly of the apparatus.

* * * * *

UNITED STATES PATENT AND TRADEMARK OFFICE
CERTIFICATE OF CORRECTION

PATENT NO. : 6,689,254 B1
DATED : February 10, 2004
INVENTOR(S) : Hurwitt

It is certified that error appears in the above-identified patent and that said Letters Patent is hereby corrected as shown below:

Title page,
Item [*] Notice, should read -- This patent application was filed prior to June 8, 1995, thus no Patent Term Extension or Adjustment applies. --

Signed and Sealed this

Twenty-second Day of June, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,689,254 B1
DATED : February 10, 2004
INVENTOR(S) : Hurwitt

It is certified that error appears in the above-identified patent and that said Letters Patent is hereby corrected as shown below:

Title page,
Item [56], References Cited, U.S. PATENT DOCUMENTS,
"3,741,886… Urbanck et al." should read -- 3,741,886… Urbanek et al. --.

Column 8,
Line 44, reads "which secured to the adapter 20 by" should read -- which is secured to the adapter 20 by --.

Column 9,
Line 2, "the rim 34c is illustrated a peripheral" should read -- the rim 34c is illustrated as a peripheral --.

Column 10,
Line 10, "described and above and illustrated in" should read -- described above and illustrated in --.

Column 11,
Line 7, "and the vacuum-sealing and water sealing-surfaces are on the sputtering material." should read -- and the vacuum-sealing and water-sealing surfaces are on the sputtering material. --.

Signed and Sealed this

Ninth Day of November, 2004

JON W. DUDAS
*Director of the United States Patent and Trademark Office*